(12) United States Patent
Katayama

(10) Patent No.: US 7,176,381 B2
(45) Date of Patent: Feb. 13, 2007

(54) PRINTED CIRCUIT BOARD AND METHOD OF PRINTING IDENTIFICATION MARKS

(75) Inventor: Tatsuo Katayama, Fukui (JP)

(73) Assignee: Orion Electric Co., Ltd., Takefu (JP)

( * ) Notice: Subject to any disclaimer, the term of this patent is extended or adjusted under 35 U.S.C. 154(b) by 14 days.

(21) Appl. No.: 11/077,247

(22) Filed: Mar. 10, 2005

(65) Prior Publication Data

US 2005/0199421 A1 Sep. 15, 2005

(30) Foreign Application Priority Data

Mar. 15, 2004 (JP) ............................ 2004-072981

(51) Int. Cl.
*H05K 1/00* (2006.01)
(52) U.S. Cl. ...................... 174/250; 257/797
(58) Field of Classification Search ................ 174/250; 257/797

See application file for complete search history.

(56) References Cited

U.S. PATENT DOCUMENTS 6,549,419 B1 * 4/2003 Nakano et al. ............. 361/749
6,967,290 B2 * 11/2005 Abe ........................... 174/250
2003/0193789 A1 * 10/2003 Karlicek

FOREIGN PATENT DOCUMENTS

| JP | 3-63966 | 6/1991 |
|----|---------|--------|
| JP | 3000794 | 6/1994 |

* cited by examiner

*Primary Examiner*—Dean A. Reichard
*Assistant Examiner*—Yuriy Semenenko
(74) *Attorney, Agent, or Firm*—Flynn, Thiel, Boutell & Tanis, P.C.

(57) ABSTRACT

It is an object of the invention to provide a printed circuit board capable of easily connecting a plurality of ground patterns corresponding to a plurality of circuit blocks, and of easily selecting the combination of the connection of the plurality of ground patterns. The printed circuit board has a plurality of blocks and a plurality of ground patterns are formed on the circuit blocks. Provided on the adjacent ground patterns are short lands, respectively, printed on the ground patterns disposed opposite to the ground patterns. Identification marks are printed adjacent to the short lands for identifying to which circuit block the short land belongs.

2 Claims, 4 Drawing Sheets

PRINTED CIRCUIT BOARD AND METHOD OF PRINTING IDENTIFICATION MARKS

FIELD OF THE INVENTION

The invention relates to a printed circuit board on which circuit components are mounted corresponding to a plurality of circuit blocks.

BACKGROUND OF THE INVENTION

In electronic equipment such as a TV receiver, a video recorder, and the like, many electronic circuits are partitioned into and mounted on a plurality of circuit blocks for every function thereof. Although wiring patterns are printed on respective circuit blocks and many circuit components are mounted on the respective circuit blocks, the wiring patterns become complicated because many circuit components are mounted more compactly so that the wiring patterns are hardly seen with the naked eye. Accordingly, the efficiency of an operation such as inspecting the printed circuit board, and the like, is reduced.

To cope with such problems, for example, a first patent literature, i.e. JP 3-63966 U discloses the indication of symbols on a circuit board, provided with a plurality of terminals and copper foil circuits connected to the respective terminals, adjacent to the terminals, and indication of arrows showing a flowing direction of a current and symbols on the copper foil circuits. Further, a second patent literature, i.e. JP 3000794 Y, discloses a printed wiring board having non-segmented patterns for a plurality of types of signals wherein the corresponding types of signals are indicated inside non-segmented pattern areas. Still further, a third patent literature, i.e. JP 2001-339229 A, discloses a phase shifter and a low noise amplifier formed on a substrate wherein band-shaped conductive connection portions are disposed adjacent to each other, respectively, on the phase shifter and the low noise amplifier, and they have short lands for facilitating soldering and through holes for test probes, respectively, at the tip end portion thereof.

Provided that a group of circuit components corresponding to a plurality of circuit blocks are mounted on a printed circuit board, ground patterns are formed on respective wiring patterns corresponding to the respective circuit blocks, and a group of the circuit components are mounted on the printed circuit board as a batch. Accordingly, the respective ground patterns are to be connected to each other, respectively, to be grounded. If the ground patterns of the plurality of circuit blocks are connected to each other, respectively, there is a possibility of the occurrence of an influence upon the circuit operation and influence of noise in the respective blocks. Accordingly, there is needed a confirmation operation for confirming the restraining of such an influence in what manner the circuit blocks are connected to each other, respectively. Meanwhile, although it is needed in such a confirmation operation to identify the ground patterns of the circuit blocks, since the wiring patterns are printed in a very complicated manner, it takes a lot of time to identify the wiring patterns with the naked eye, thereby reducing the operation efficiency.

Although it is considered to indicate symbols and the like on the wiring patterns, as disclosed in the first and second patent literatures, if the ground patterns are very complicated, it is necessary to indicate symbols and the like on the entire ground patterns, which is not realistic. Further, it is considered to form the short lands as disclosed in the third patent literature, a plurality of short lands have to be formed corresponding to the ground patterns if there exist a plurality of ground patterns, making it unable to identify as to which circuit blocks the short lands correspond to, so that an improvement in operational efficiency cannot be expected.

SUMMARY OF THE INVENTION

To that end, it is an object of the invention to provide a printed circuit board capable of easily connecting a plurality of ground patterns corresponding to a plurality of circuit blocks to each other, respectively, and of easily selecting the combination of the connection of the plurality of ground patterns, and also to provide a method of printing identification marks.

The printed circuit board of the first aspect of the invention is characterized in comprising a plurality of wiring patterns printed, respectively, corresponding to a plurality of circuit blocks, a plurality of short lands electrically connected to and printed onto ground patterns of the wiring patterns, respectively, and disposed opposite to positions where the ground patterns can be electrically connected to each other, respectively, and identification marks indicated adjacent to the short lands for identifying the circuit blocks corresponding to the wiring patterns electrically connected to each other, respectively, by the short lands.

The method of printing identification marks of the second aspect of the invention is characterized in comprising the steps of reading out mounting position information of the circuit components to be mounted on a printed circuit board and printing position information of short lands, deciding the circuit components mounting positions of which are set on the ground patterns onto which the short lands are to be printed, reading out the identification marks corresponding to the circuit blocks including the decided circuit components, deciding printing positions of the identification marks based on the decided printing position information of the short lands, and printing the identification marks on the printed circuit board based on the decided printing position information.

With the configuration set forth above, since the short lands capable of connecting the adjacent ground patterns of the wiring patterns corresponding to the plurality of circuit blocks are printed in advance, and identification marks for identifying the circuit blocks are indicated adjacent to the printed short lands, it is easy to find the short lands of the corresponding ground patterns by the identification marks even in the case of connection between the ground patterns of any circuit block. Since the short lands of the adjacent ground patterns are disposed to oppose each other, respectively, the operation for connecting the ground patterns can be effected with ease. Accordingly, in the case of effecting an operation of inspecting the influence of, e.g. noise, while changing the combination of connection between the circuit blocks, the operational efficiency can be dramatically enhanced.

Further, since the method of printing identification marks comprises the steps of reading out mounting position information of circuit components to be mounted on a printed circuit board and printing position information of short lands, deciding the circuit components mounting positions of which are set on the ground patterns onto which the short lands are to be printed, reading out the identification marks corresponding to the circuit blocks including the decided circuit components, deciding printing positions of the identification marks based on the decided printing position information of the short lands, and printing the identification marks on the printed circuit board based on the decided printing position information, the printing positions of the short lands are determined so that the identification marks of the circuit blocks corresponding to the determined printing positions are automatically printed, thereby enabling the indication of the short lands and the identification marks corresponding to the short lands with more accuracy and simplicity.

PREFERRED EMBODIMENT OF THE INVENTION

An embodiment of the invention is now described in detail. Since the embodiment described hereinafter is a preferred specific example for working out the invention, it is variously limited technically, but the invention is not limited to the embodiment unless explicitly limiting the invention to the embodiment.

Figure 1:
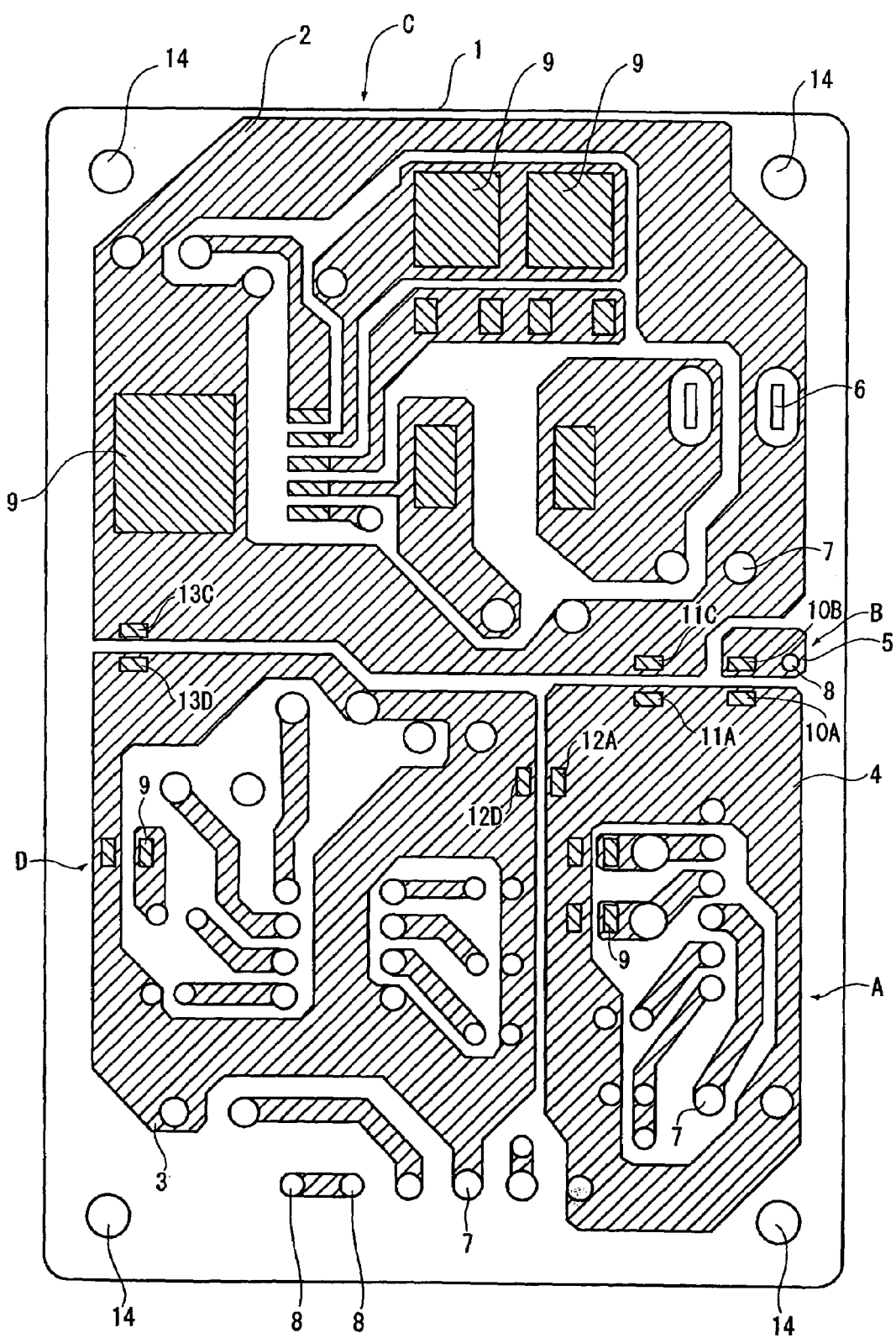
FIG. 1 is a view showing wiring patterns according to an embodiment of the invention.
Figure 2:
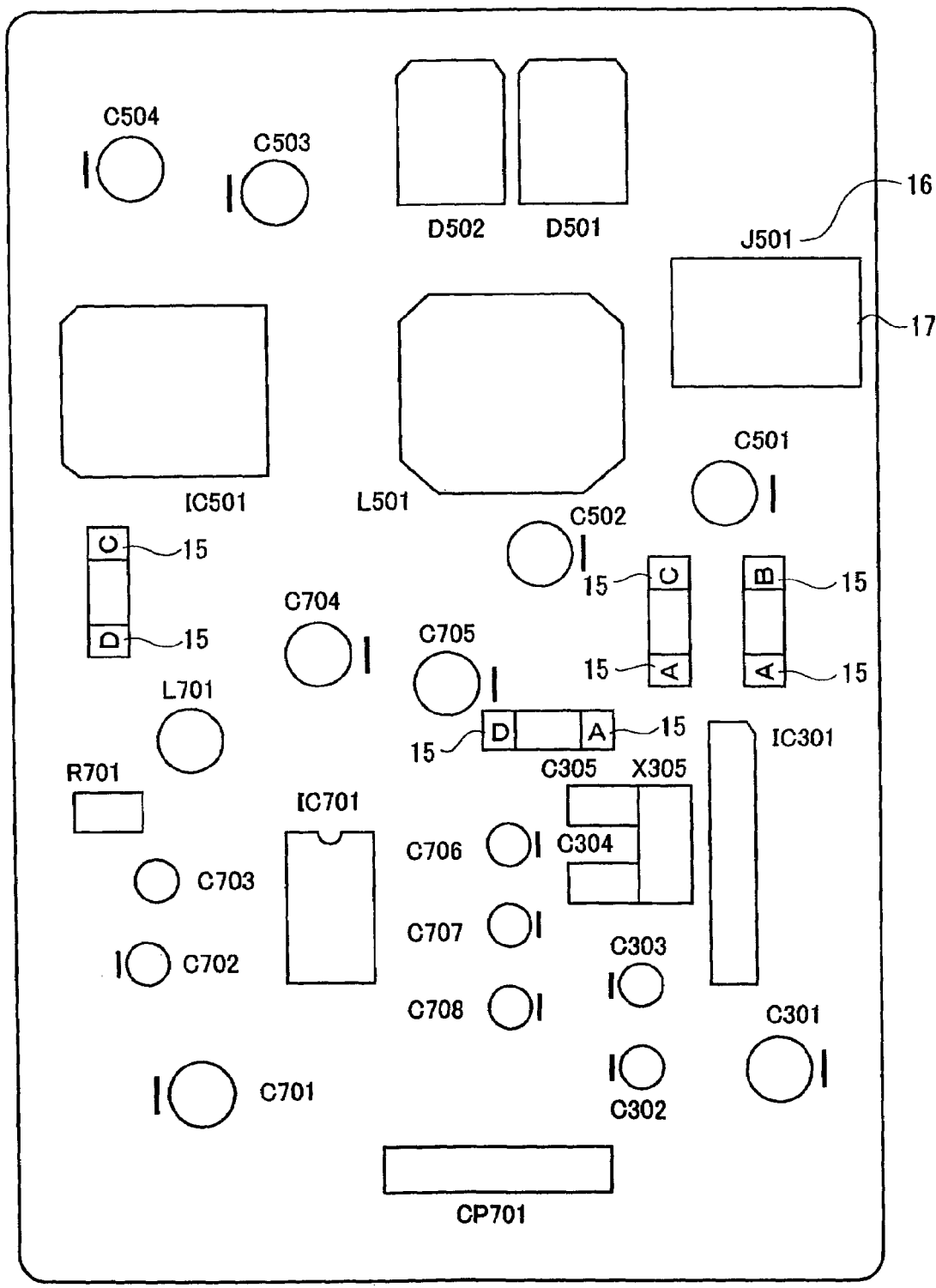
FIG. 2 is a view showing a layout of circuit components of the invention.

FIG. 1 is a view showing wiring patterns of a printed circuit board 1 according to an embodiment of the invention, and FIG. 2 is a printed pattern wherein symbols (patterns and component numbers) of circuit components to be mounted on the printed circuit board 1 are laid out in correspondence with the wiring patterns shown in FIG. 1. Four rectangular circuit blocks A, B, C and D are mounted on the printed circuit board 1, and wiring patterns of the circuit blocks A, C and D are illustrated but the wiring pattern of the circuit block B is printed on an opposite face, not shown. The respective circuit blocks show respective circuits, more in detail, the circuit block A shows a digital signal processing circuit, the circuit block B shows a control circuit, the circuit block C shows a power supply circuit, and the circuit block D shows an analog signal processing circuit.

Regarding the circuit block A, a ground pattern 4 is formed to surround a block area (indicated by left downwardly hatched portion), and wiring patterns (indicated by left downwardly hatched portion) for electrically connecting the circuit components are printed in the ground pattern 4 and terminal insertion holes 7 (indicated by circles) are bored in the ground pattern 4. Further, areas 9 (indicated by right downwardly hatched portion) onto which soldering is printed so as to effect surface mounting are formed on the wiring pattern, and short lands 10A, 11A and 12A are printed onto the ground pattern 4. Regarding the circuit block B, a short land 10B is formed on a ground pattern 5 which is connected to an opposite side ground pattern by way of a through hole 8. Regarding the circuit block C, a ground pattern 2 is formed to surround a block area (indicated by left downwardly hatched portion), and a wiring pattern (indicated by downwardly hatched portion) for electrically connecting the circuit components is printed in the ground pattern 2, and terminal insertion holes 6 (indicated by a rectangular shape) and 7 (indicated by circles) are bored in the ground pattern 2. Further, areas 9 (indicated by right downwardly hatched portion) onto which soldering is printed so as to effect surface mounting are formed on the wiring pattern 2, and short lands 11C and 13C are printed onto the ground pattern 2. Regarding the circuit block D, a ground pattern 3 is formed to surround a block area (indicated by left downwardly hatched portion), and a wiring pattern (indicated by left downwardly hatched portion) for electrically connecting the circuit components is printed in the ground pattern 3 and terminal insertion holes 7 (indicated by circles) are bored in the ground pattern 3. Further, areas 9 (hatched right downward) onto which soldering is printed so as to effect surface mounting are formed on the ground pattern 3, and short lands 12D and 13D are printed onto the ground pattern 3. Fitting holes 14 are bored in four corners of the printed circuit board 1.

As shown in FIG. 2, patterns 17 and component numbers 16 serving as symbols are given to the circuit components to be mounted on the respective circuit blocks at the designing phase, and these patterns 17 and component numbers 16 are stored in a storage portion, described later, together with mounting position information. In this embodiment, each component number 16 is formed of one or two characters of an alphabet and three digits wherein the alphabet indicates the types of components (C; capacitor, D; diode, IC; integrated circuit, and the like), and the most significant digit indicates the types of circuit blocks (A; 3, B; 6, C; 5, D; 7), and two digits from the bottom are given to each circuit components. Accordingly, the types of circuit components and the types of circuit blocks can be identified by the component numbers. Each pattern 17 shows an outside shape of each circuit component, for example, the capacitor is shown by a circle and a polarity is drawn by a bold line adjacent to the circle.

The patterns 17 and the component numbers 16 of the circuit components are positioned so as to be printed in correspondence with mounting positions of the circuit components when they are printed onto the wiring patterns shown in FIG. 1. Regarding the combination of short lands, 10A, 10B; 11A, 11C; 12A, 12D; 13C, 13D, squares showing jumper chips and identification marks 15 for identifying respective short lands are laid out on these short lands. Since the identification marks 15 are printed onto the ground pattern 4 of the circuit block A in the case of the short land 10A, "A" serving as the identification marks 15 are laid out, while since the identification marks 15 are printed onto the ground pattern 5 of the circuit block B in the case of the short land 10B, "B" serving as the identification marks 15 are laid out. Regarding other short lands, they are disposed opposite to the adjacent ground patterns and laid out, so that the identification marks of the corresponding circuit blocks are indicated to close to each other, respectively.

Figure 3:
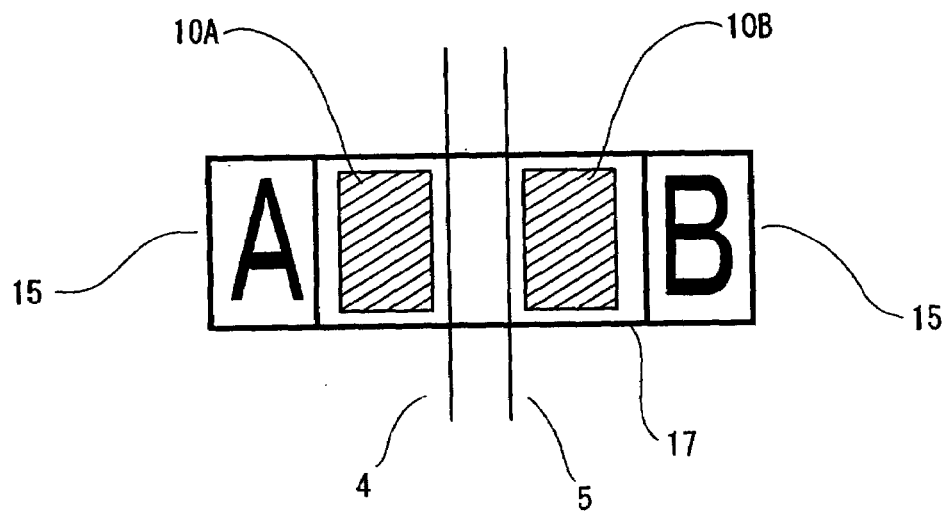
FIG. 3 is a partially enlarged view of short lands.

FIG. 3 is an enlarged view showing a part of the short lands 10A and 10B in cases where the printing pattern in FIG. 2 is printed onto the wiring patterns shown in FIG. 1, wherein the short lands 10A and 10B are disposed opposite to each other, and FIG. 3 shows that the square pattern 17 is printed so as to cover the short lands 10A and 10B, and a jumper chip is mounted on the short lands 10A and 10B. "A" and "B" serving as the identification marks 15 are printed onto the respective short lands.

Accordingly, in cases where the ground patterns of the circuit blocks are connected to each other, respectively, it is sufficient to search for identification marks corresponding to the combination of the circuit blocks to be connected to each other, respectively, and to connect the short lands which are disposed opposite to each other, respectively, so that it is not necessary to effect an operation while confirming the ground patterns of the circuit blocks one by one, thereby dramatically improving the operational efficiency. In the case of connection of the short lands, the short lands, which are disposed opposite to each other, may be connected to each other, respectively, by soldering or a jumper chip may be mounted between short lands. In any event, the connecting operation of the short lands can be effected with ease.

Figure 4:
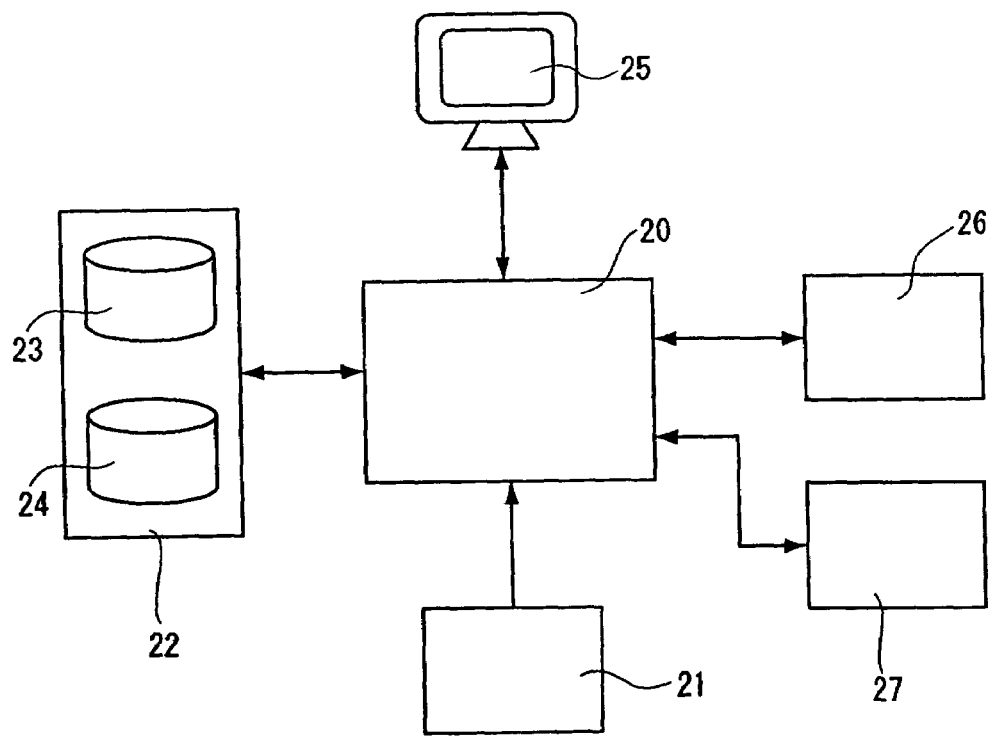
FIG. 4 is a block diagram showing configurations of units for printing identification marks.

FIG. 4 is a block diagram showing configurations of units for printing identification marks. A CPU 20 effects control of the entire units and a ROM 21 stores therein a program necessary for controlling the entire units and the like. A storage portion 22 has component information DB23 which stores therein data relating to the circuit components to be mounted on the printed circuit board, and mounting information DB 24 which stores therein data relating to the mounting of circuit components which are set at the time when the printed circuit board was designed. The wiring pattern and the like to which the indication of the identification marks which are processed by the CPU 20 are added are displayed on a monitor 25 as an image. A printing portion 26 prints finally decided identification marks onto the printed circuit board. Data necessary for arithmetic and control are inputted through an input portion 27.

The identification marks corresponding to the circuit blocks to be mounted on the printed circuit board are stored in the mounting information DB 24 together with pattern symbols corresponding to the respective circuit components, component numbers and the mounting position information. The mounting position information of the respective circuit components is information representing each interval between a reference position on the printed circuit board and a reference point on each circuit component per se (e.g., central point), and it can be represented, for example, by use of a distance or an angle. The reference point and the terminal position of each circuit component per se are stored in the component information DB 23 and can be appropriately read out at the designing phase. Further, the printing position information of the ground patterns and printing position information of the short lands are also stored in the mounting information DB 24.

Figure 5:
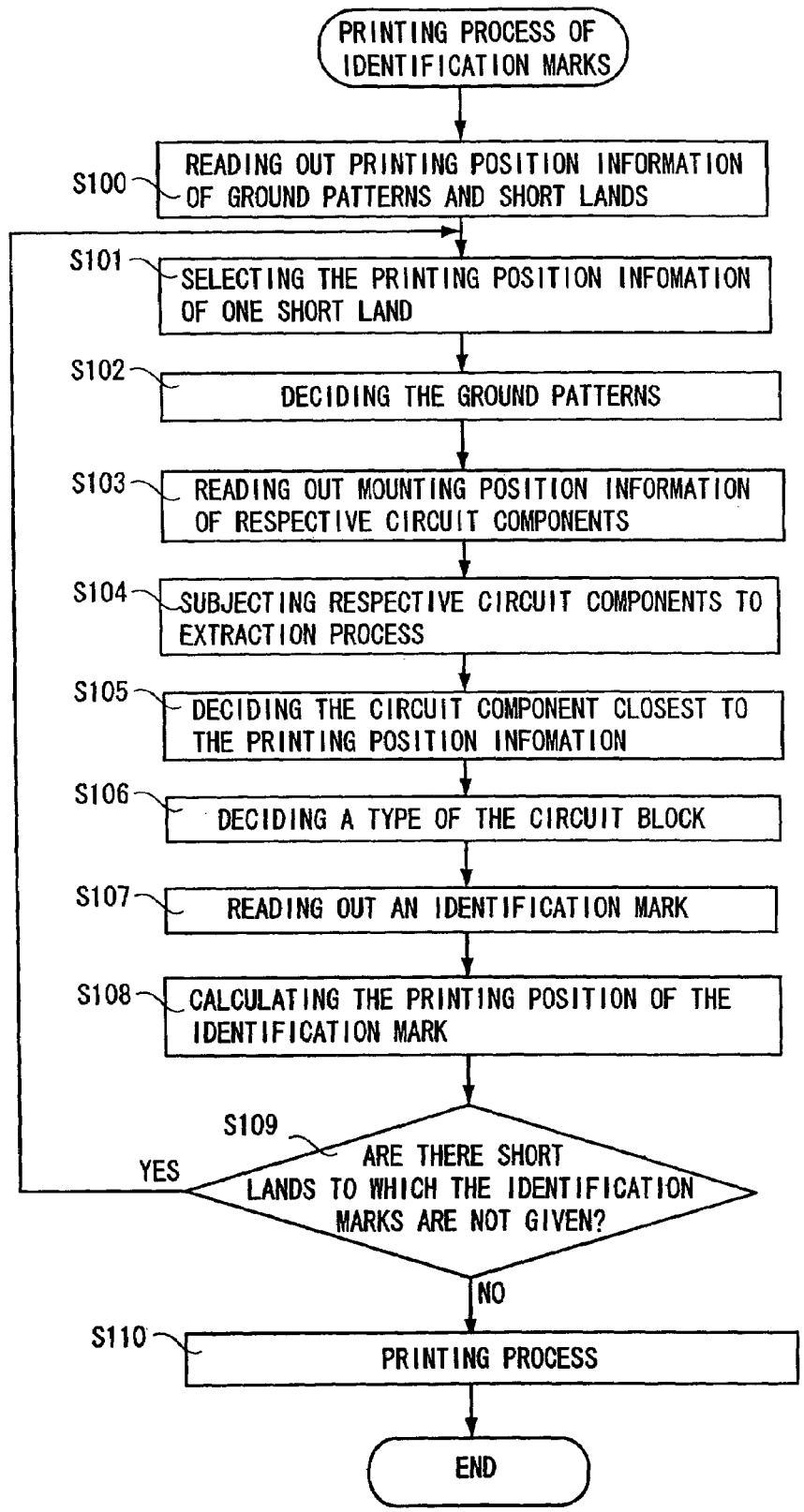
FIG. 5 is a flow chart showing printing process of the identification marks.

FIG. 5 is a flow chart showing a printing process of the identification marks. Printing position information of the ground patterns and short lands are first read out (S100), then the printing position information of one short land is selected (S101). The printing position information of the selected ground pattern is compared with printing position information of the ground patterns to decide on which ground patterns the short land is positioned (S102). Subsequently, mounting position information of the respective circuit components are read out (S103) and they are compared with the printing position information of the ground pattern on which, it is decided, the short land is positioned, and a circuit component connected to the ground pattern is subjected to an extraction process (S104). The mounting position information of the circuit component which was subjected to the extraction process is compared with printing position information of the short land so as to decide the circuit component to be positioned closest to the printing position information of the short land (S105). The type of circuit block is decided based on the component number of the decided circuit components (S106). For example, as mentioned above, if the types of circuit blocks are included in the component numbers, the circuit block can be easily decided. Then, an identification mark corresponding to the type of the decided circuit block is read out (S107), subsequently, the printing position information of the identification mark can be calculated based on the printing position information of the short land (S108). For example, provided that the printing position of the identification mark is set at the printing position of the short land opposite to a boundary of the ground pattern while spaced in a predetermined interval. In such a manner, the identification marks can be laid out on the printing pattern as shown in FIG. 2.

Upon completion of each process as set forth above, it is checked as to whether there are short lands to which the identification marks are not given (S109), and if there are such short lands, a program returns to the step S101 where the printing position information of one short land is selected. If there is no short land, the printing pattern, on which the identification marks are laid out, are printed onto the wiring patterns (S110), and finally the program ends.

If each process as set forth above is automatically effected, the identification marks can be correctly printed onto the respectively short lands. Although both the short lands and the identification marks are separately subjected to the printing process according to the printing process of the invention, they may be registered together, and the identification marks may be set when the short lands are set. In such a case, the identification marks may be printed onto the wiring patterns with open characters.

The disclosure of Japanese Patent Application No. 2004-072981 including specification, claims, and drawings, is incorporated herein by reference thereto.

What is claimed is:

1. A printed circuit board comprising:
a plurality of wiring patterns printed, respectively, corresponding to a plurality of circuit blocks formed on one circuit board;
a plurality of short lands electrically connected to and printed onto ground patterns of the wiring patterns, respectively, and disposed opposite to positions where the ground patterns can be electrically connected to each other, respectively; and
identification marks adjacent to the short lands for identifying the circuit blocks corresponding to the wiring patterns by which respective short lands are connected to each other.

2. A method of printing identification marks comprising the steps of:
reading out mounting position information of circuit components to be mounted on a printed circuit board and printing position information of short lands; deciding the circuit components mounting positions of which are set on the ground patterns onto which the short lands are to be printed; reading out the identification marks corresponding to the circuit blocks including the decided circuit components; deciding printing positions of the identification marks based on the decided printing position information of the short lands; and printing the identification marks on the printed circuit board based on the decided printing position information.

* * * * *